(12) United States Patent
Ricavy et al.

(10) Patent No.: US 8,193,847 B2
(45) Date of Patent: Jun. 5, 2012

(54) TIMING CIRCUIT AND METHOD OF GENERATING AN OUTPUT TIMING SIGNAL

(75) Inventors: Sebastien Nicolas Ricavy, Saint Martin D'Heres (FR); Nicolaas Klarinus Johannes van Winkelhoff, Villard-Bonnot (FR); Gerald Jean Louis Gouya, Grenoble (FR)

(73) Assignee: ARM Limited, Cambridge (GB)

( * ) Notice: Subject to any disclaimer, the term of this patent is extended or adjusted under 35 U.S.C. 154(b) by 65 days.

(21) Appl. No.: 12/923,724

(22) Filed: Oct. 5, 2010

(65) Prior Publication Data

US 2012/0081164 A1    Apr. 5, 2012

(51) Int. Cl.
  *G06F 1/04* (2006.01)
(52) U.S. Cl. .......................... 327/291; 327/172; 327/299
(58) Field of Classification Search .................. 327/91, 327/94–95, 172–175, 291–299
See application file for complete search history.

(56) References Cited

U.S. PATENT DOCUMENTS 7,116,150 B2 * 10/2006 Francom ...................... 327/178
7,557,632 B2 *  7/2009 Kim .............................. 327/299

* cited by examiner

*Primary Examiner* — An Luu
(74) *Attorney, Agent, or Firm* — Nixon & Vanderhye P.C.

(57) ABSTRACT

A timing circuit and corresponding method are provided to generate an output timing signal in dependence on an input timing signal. The timing circuit comprises a plurality of circuit components, each circuit component configured to receive an input dependent on the input timing signal and to generate an output in dependence on that input. Each circuit component performs switching operations by switching its output level in response to a transition of its input level. Each circuit component exhibits a delay in switching its output level, the delay comprising a first delay associated with a first switching of its output level and a second delay associated with a second switching of its output level. The first switching is in an opposite direction to the second switching and the first delay and the second delay exhibit a change in magnitude as each circuit component repeatedly performs its switching operations. This change in magnitude is in opposite directions for the first delay and the second delay respectively, and the plurality of circuit components are arranged such that a timing of the output timing signal is dependent on both said first delay and said second delay, such that the effects of each on the timing of the output signal counteract one another.

24 Claims, 9 Drawing Sheets

TIMING CIRCUIT AND METHOD OF GENERATING AN OUTPUT TIMING SIGNAL

BACKGROUND OF THE INVENTION

1. Field of the Invention

The present invention is concerned with timing circuits. In particular the present invention is concerned with timing circuits configured to generate an output timing signal in dependence on an input timing signal.

2. Description of the Prior Art

It is known to provide a timing circuit which is configured to generate an output timing signal in dependence on an input timing signal. For example within a data processing apparatus an external clock signal may be converted into an internal clock signal for use within a subcomponent of that data processing apparatus. One such example is a self-timed memory system within a data processing apparatus which uses a external clock signal provided by the data processing apparatus to generate a internal clock signal used within the memory system. The memory system is self-timed in the sense that only the leading edge of the external clock is used, the duration of the internal clock pulse being generated in dependence on the requirements of the memory device.

The internal timing of a memory device is known to be a critical operational parameter, since for example when a value read out from the memory device is dependent on the time evolution of the voltage of a bit line, the timing of the moment when that voltage is measured is critical to determining the value that will be read out.

An example of a known timing circuit is schematically illustrated in FIG. 1, wherein an external clock signal CLK is used to generate an internal clock signal ICLK. In the timing circuit 10, the generation of the ICLK pulse is dependent on only the rising edge of the external clock signal CLK. The rising edge of the external clock signal CLK is received by timing circuit 10 via inverter 12 and transmission gate 14. The transition of CLK causes the state held by latch 16 to invert. The resulting rising edge forms the rising edge of the generated ICLK pulse and is also passed via a feedback loop through delay unit 18, the output of which (inverted) controls PMOS transistor 20 which connects the input of latch 16 to VDD. Hence, when the delayed pulse is passed by delay unit 18, the input to latch 16 is pulled high again, causing the state held by latch 16 to invert once more, forming the falling edge of the output pulse ICLK.

However, a problem with timing circuits such as the timing circuit 10 illustrated in FIG. 1 can arise if the timing characteristics of the generated ICLK pulse change over time, since this can affect the performance of a process dependent of the timing of the ICLK pulse. Such changes in the timing characteristics of the ICLK pulse can result from a variation in the switching delay associated with each circuit component of the timing circuit. It is known that each circuit component will exhibit a delay in switching its output level following a transition of its input level. For example inverter 12 illustrated in FIG. 1 will not instantly generate a falling edge when the input CLK signal provides a rising edge, but rather after a finite delay. Since the timing of both the rising edge and the falling edge of the generated ICLK signal are dependent on this switching delay, both the absolute and relative timings of the rising and falling edges of the ICLK pulse are affected by a variation in this switching delay.

Such a variation in the switching delay can, for example, arise when the circuit components of the timing circuit are embodied as silicon-on-insulator (SOI) devices. An example SOI device is schematically illustrated in FIG. 2. The SOI device is formed on a buried oxide layer onto which further layers are laid down to form the transistor components. One characteristic of such a SOI device is that the body of the device is not tied to a reference voltage and is allowed to float. As a consequence the switching delay of a transistor such as that illustrated in FIG. 2 will evolve over time, depending on the initial voltage of the body, eventually settling down to a relatively consistent value, although this may take many switching cycles to occur. An example evolution of the switching delay of a SOI device is illustrated in FIG. 3, in which it can be seen that the SOI device must go through of the order of 10,000 switching cycles before the switching delay settles down to a relatively consistent value.

As mentioned above, the evolution of the switching delay of a circuit component forming part of a timing circuit can have a disadvantageous effect on the timing of the output timing signal generated by the timing circuit and consequently it would be desirable to provide an improved technique for providing timing circuits configured to generate an output timing signal in dependence on an input timing signal.

SUMMARY OF THE INVENTION

Viewed from a first aspect, the present invention provides a timing circuit configured to generate an output timing signal in dependence on an input timing signal, said timing circuit comprising:

a plurality of circuit components, each circuit component configured to receive an input dependent on said input timing signal and to generate an output in dependence on said input, each circuit component configured to perform switching operations by switching an output level of said output in response to a transition of an input level of said input, wherein each circuit component exhibits a delay in switching said output level following said transition of said input level, said delay comprising a first delay associated with a first switching of said output level and a second delay associated with a second switching of said output level, said first switching being in an opposite direction to said second switching, and wherein said first delay and said second delay exhibit a change in magnitude as each circuit component repeatedly performs said switching operations, said change in magnitude being in opposite directions for said first delay and said second delay respectively; and said plurality of circuit components arranged such that a timing of said output timing signal is dependent on both said first delay and said second delay.

The inventors of the present invention realised that although the timing of an output timing signal from a timing circuit is sensitive to variations in a first switching delay of the circuit components of the timing circuit, this effect can be counteracted by arranging the circuit components such that the timing of the output timing signal is also dependent on a second switching delay associated with a second switching of each of the circuit components, where the variation of the second switching delay causes the second switching delay to evolve in the opposite direction to the first switching delay. In other words, as one delay gets longer the other gets shorter.

For example, when a first switching of a circuit component switches the output level of that circuit component from low to high, whilst the switching delay associated with this first switching of the output level will typically tend to decrease as the circuit component repeatedly performs its switching operations, conversely the delay associated a second switching of the circuit component, wherein the output level is returned from high to low, will then tend to increase as the circuit component repeatedly performs its switching operations. The present invention makes use of this characteristic to address the adverse effects of the time evolution of the first delay associated with a first switching of the output level of each circuit component, by arranging the plurality of circuit components of the timing circuit such that the timing of the output timing signal is dependent on both the first delay and the second delay. Whilst the introduction of this further delay to the timing of the output timing signal means that the absolute timing of the output timing signal may be slightly delayed, this will typically be less important than the relative timing of the output signal. For example, when the output signal is the edge of a clock pulse, it is the relative timing of that clock pulse edge that matters, namely that the clock pulse edge should not creep over time.

It will be recognised that it is the evolution in opposite directions with respect to one another of the first delay and the second delay which enables the time evolution of the first delay to be counteracted. It will typically be the case that the first delay associated with the first switching of the output level will reduce over the course of the switching operations and accordingly in such embodiments said first delay becomes shorter and said second delay becomes longer as said circuit components repeatedly perform said switching operations. However, the opposite configuration is also possible and in such embodiments said first delay becomes longer and said second delay becomes shorter as said circuit components repeatedly perform said switching operations.

The plurality of circuit components could take a number of forms, but in one embodiment said plurality of circuit components comprises: a switching unit configured to perform both said first switching and said second switching in response to said transition of said input level; and an output signal generator configured to generate said output timing signal in dependence on said second switching of said switching unit. The provision of a switching unit which performs said first switching and said second switching in response to the transition of the input level means that for a single transition of the input level both the first delay associated with the first switching and the second delay associated with the second switching are introduced into this signal path. Then, by configuring the output signal generator to generate said output timing signal in dependence on the second switching, for a single transition of the input level, an output timing signal is generated for which the time variation is significantly reduced with respect to the time evolution of either the first delay or the second delay, since the effect of each counteracts the other.

In some embodiments said switching unit comprises a pulse generation circuit and said output signal generator comprises an edge selection circuit, said pulse generation circuit configured to generate a pulse formed of a first edge and a second edge in response to a transition of said input timing signal; and said edge selection circuit configured to generate said output timing signal in dependence on said second edge. Accordingly, the pulse generation circuit will switch twice to generate the pulse, a first time to generate the first edge of the pulse and the second time to generate the second edge of the pulse. Then, by arranging the edge selection circuit to generate the output timing signal in dependence on the second edge, an efficient mechanism is provided for producing an output timing signal which has its timing dependent on both the first switching delay and the second switching delay.

Although the timing circuit could be configured with the pulse generated by the pulse generation circuit being passed directly to the edge selection circuit, in one embodiment the timing circuit further comprises a delay circuit, said delay circuit configured to receive said pulse from said pulse generation circuit and to provide said edge selection circuit with a delayed pulse. This delay circuit thus enables the timing of the output timing signal to be controlled by virtue of the amount of delay introduced by the delay circuit, but in particular, since the switching unit has introduced a second switching delay to the signal propagation, the delay circuit can adjust when the second edge is received by the edge selection circuit and hence the timing of the output timing signal.

In some embodiments the timing circuit further comprising a latch circuit, said latch circuit configured to generate a first clock pulse edge in response to said transition of said input timing signal and to generate a second clock pulse edge in response to said output timing signal. Accordingly a clock pulse consisting of two clock pulse edges can be generated, wherein the timing of the second clock pulse edge is particularly stable.

In some embodiments said plurality of circuit components comprises a first set of circuit components and a second set of circuit components, wherein said first set of circuit components contribute only said first delay to said timing of said output timing signal and said second set of circuit components contribute only said second delay to said timing of said output timing signal. Hence according to this arrangement the system designer can influence the timing of the output timing signal by the selection the first set and second set of circuit components.

Since each of the circuit components of the first set of circuit components contributes the first delay to the timing of the output signal and each of the circuit components of the second set of circuit components contributes the second delay to the timing of the output signal, the system designer can selectively tune the timing of the output timing signal by selecting how many components are in each set. In one embodiment a number of said first set of circuit components and a number of said second set of circuit components are selected such that said timing of said output timing signal is substantially constant as said circuit components repeatedly perform said switching operations.

In another embodiment a number of said first set of circuit components and a number of said second set of circuit components are selected such that said timing of said output timing signal does not become earlier as said circuit components repeatedly perform said switching operations. This may be of particular advantage in applications where the output timing signal is arranged to be produced as early as possible. Allowing the output timing signal to drift earlier in time would then jeopardize the reliable operation of those applications. For example in the context of a memory circuit, where the output timing signal triggers part of the read out procedure of the memory, the timing of the output signal can be critical. Since a memory will typically be configured to produce its read out at the earliest possible moment, any evolution of the timing of the output timing signal towards earlier times could cause the reading procedure to fail.

The timing circuit could be implemented in various situations, however in one embodiment said timing circuit is a delay circuit. For example where a clock pulse is initiated by a transition of the input timing signal and the clock pulse is completed by taking a delayed version of the input timing transition, the timing circuit of the present invention can ensure that the width of the clock pulse is more consistently maintained.

It will be appreciated that in each circuit component the direction of the first switching and second switching will depend on a previous input level. In some embodiments, said first switching is performed in response to a rising edge of said input level and said second switching is performed in response to a falling edge of said input level. In other embodiments said first switching is performed in response to a falling edge of said input level and said second switching is performed in response to a rising edge of said input level.

In some embodiments, said switching operations cause said first delay and said second delay to evolve to steady state values. For example, the variation in the first delay and second delay may depend on the previous switching activity of the circuit components, the greatest variation occurring when the timing circuit has previously been inactive, with the variation in the first and second delays decreasing with repeated switching operations of the circuit components until said first delay and said second delay take relatively constant steady state values.

The timing circuit may be formed in a number of ways, but in one embodiment said timing circuit is a silicon-on-insulator device. Such silicon-on-insulator (SOI) devices can exhibit a noticeable history effect wherein the switching delay of a SOI component is dependent on the previous activity of that SOI component. As such the techniques of the present invention are of particular benefit to counteract the consequence of this history effect.

In some embodiments, during activity of said timing circuit said timing circuit is configured to hold said input timing signal at a predetermined value. In order to provide a consistent and well-defined response of the timing circuit when it is activated after a period of inactivity, it is advantageous if during that period of inactivity the input timing signal is held at a predetermined value.

The timing circuit could be used in a number of ways, but in one embodiment said timing circuit is a memory device timing circuit. The reliable operation of a memory device can be critically dependent on consistent timing signals and the output timing signal of the timing circuit can provide such a consistent timing signal.

The timing circuit could be used in a number of places in a memory device, but one component of a memory device which particularly benefits from consistent timing is a sense amplifier and in one embodiment said memory device timing circuit is a sense amplifier timing circuit. In particular, in a memory device, the timing of the enabling of a sense amplifier is a critical parameter and in one embodiment said output timing signal initiates a sense amplifier enable signal.

Within a memory device which uses the output timing signal to initiate a sense amplifier enable signal, in one embodiment said input timing signal initiates a word line activation signal. Hence, the input timing signal is used to activate a word line within the memory device and the timing circuit then generates the output timing signal to initiate the sense amplifier enable signal in dependence on the same signal. Consequently the timing circuit can be used to ensure that a consistent time difference is maintained between word line activation and sense amplifier enablement, which is a critical time period for the accurate and reliable operation of a memory device.

Viewed from a second aspect the present invention provides a memory device comprising a timing circuit according to the first aspect of the invention.

Viewed from a third aspect the present invention provides a non-transitory recording medium storing computer-readable instructions configured to generate a timing circuit according to the first aspect of the invention.

Viewed from a fourth aspect, the present invention provides a timing circuit configured to generate an output timing signal in dependence on an input timing signal, said timing circuit comprising:

a plurality of circuit component means, each circuit component means for receiving an input dependent on said input timing signal and generating an output in dependence on said input, each circuit component means for performing switching operations by switching an output level of said output in response to a transition of an input level of said input, wherein each circuit component means exhibits a delay in switching said output level following said transition of said input level, said delay comprising a first delay associated with a first switching of said output level and a second delay associated with a second switching of said output level, said first switching being in an opposite direction to said second switching, and wherein said first delay and said second delay exhibit a change in magnitude as each circuit component repeatedly performs said switching operations, said change in magnitude being in opposite directions for said first delay and said second delay respectively; and said plurality of circuit component means arranged such that a timing of said output timing signal is dependent on both said first delay and said second delay.

Viewed from a fifth aspect, the present invention provides a method of generating an output timing signal in dependence on an input timing signal, the method comprising the steps of:

in each of a plurality of circuit components receiving an input dependent on said input timing signal and generating an output in dependence on said input by performing switching operations wherein an output level of said output is switched in response to a transition of an input level of said input, wherein each circuit component exhibits a delay in switching said output level following said transition of said input level, said delay comprising a first delay associated with a first switching of said output level and a second delay associated with a second switching of said output level, said first switching being in an opposite direction to said second switching and wherein said first delay and said second delay exhibit a change in magnitude as said switching operations are repeatedly performed, said change in magnitude being in opposite directions for said first delay and said second delay respectively;

and generating said output timing signal using said plurality of circuit components such that a timing of said output timing signal is dependent on both said first delay and said second delay.

The above, and other objects, features and advantages of this invention will be apparent from the following detailed description of illustrative embodiments which is to be read in connection with the accompanying drawings.

DESCRIPTION OF EMBODIMENTS

Figure 4A:
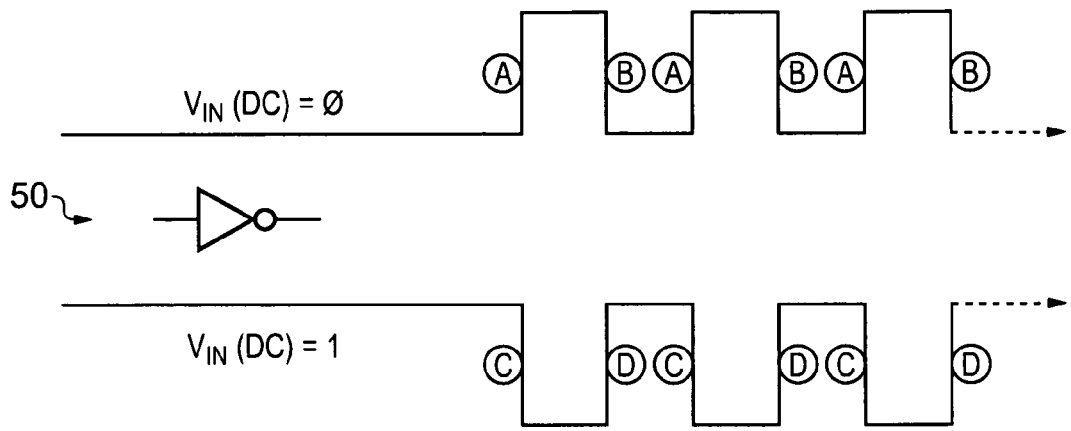
FIG. 4A schematically illustrates two switching patterns of an inverter following a period with a fixed input.

FIG. 4A schematically illustrates the input to an inverter 50 which is initially been held with a fixed input voltage (and correspondingly generating a fixed output voltage). In the first (upper) example the input voltage to the inverter has been held for an extended period at a low (logical 0) value before beginning to switch between this low value and a high (logical 1) value. The transitions A represent the first switching of the inverter when the input of the inverter switches from 0 to 1 and the transitions B are a second switching of the inverter when the input of the inverter makes a second transition from logical 1 to 0. Conversely the second (lower) example shows the input of the inverter being held at a logical 1 value before the transitions C (input changes from 1 to 0) represent a first switching of the inverter and the transitions D (input changes from 1 to 0) represent a second switching of the inverter.

Figure 4B:
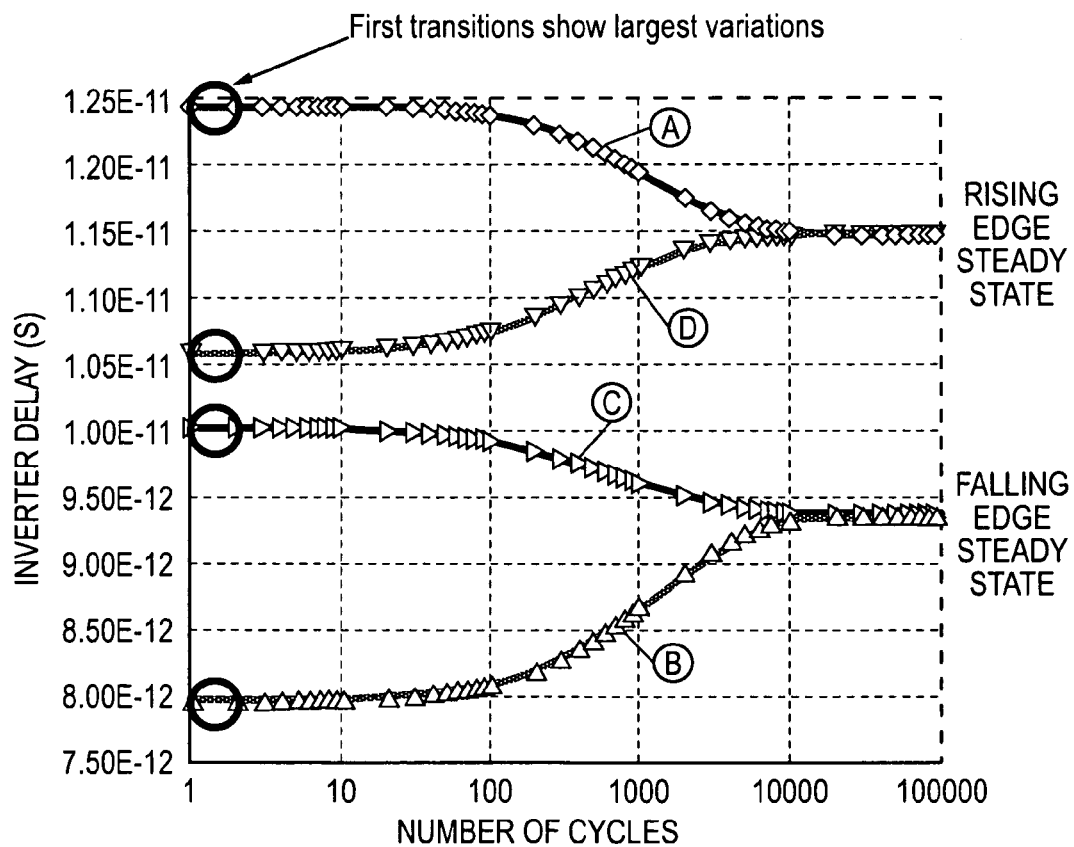
FIG. 4B illustrates the evolution of the switching delays of the first and second switchings for each switching pattern shown in FIG. 4A.

Having previously been held for an extended period with a constant input value, the inverter 50 exhibits a time evolution of the delay associated with each switching as schematically illustrated in FIG. 4B. This figure illustrates a simulation of the switching delay of an inverter such as that shown in FIG. 4A. It can be seen that the first switching (regardless of the initial input configuration) begins with a first delay associated with the first switching which is longer than the second delay associated with the second switching. Furthermore this first delay decreases with repeated switching of the inverter, finally reaching a steady state after (in this example) around 10,000 switching cycles. Conversely, it can be seen from FIG. 4B that the delay associated with the second switching of the inverter (regardless of the initial input configuration) begins with a shorter delay which evolves over the course of the switching cycles becoming longer, also reaching a steady state after around 10,000 switching cycles. Hence it can be seen that the initial state of the inverter has a residual effect on the switching delays for approximately 10,000 switching cycles before a rising edge (A or D) has a characteristic delay which is no longer affected by the switching history of the inverter and conversely a falling edge (B or C) has a characteristic delay unaffected by the switching history of the inverter.

Figure 1:
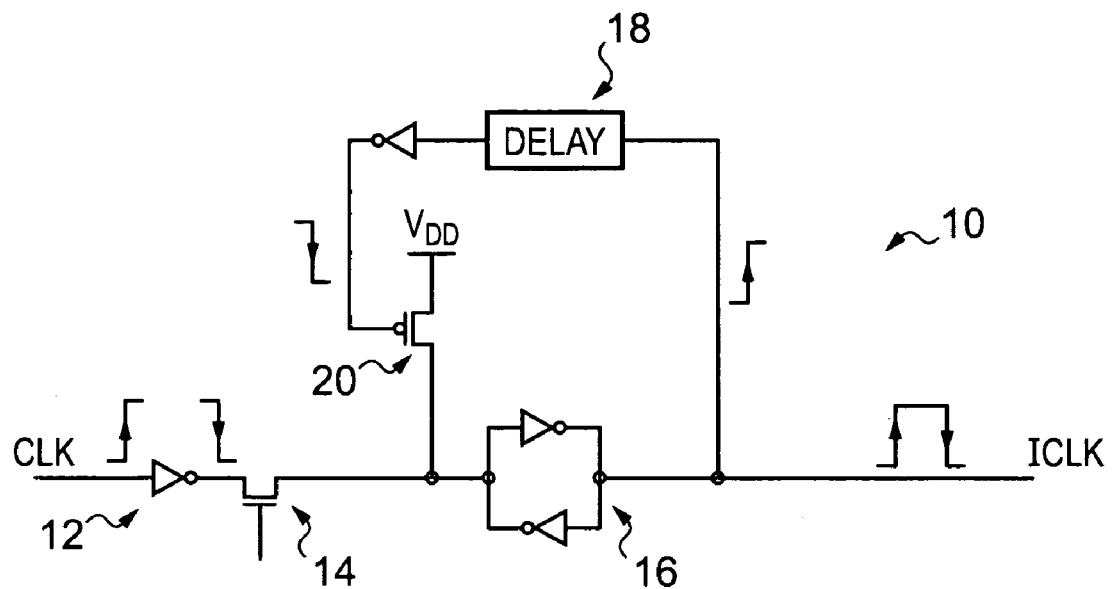
FIG. 1 schematically illustrates a known circuit for generating an internal clock signal in dependence on an external clock signal.
Figure 2:
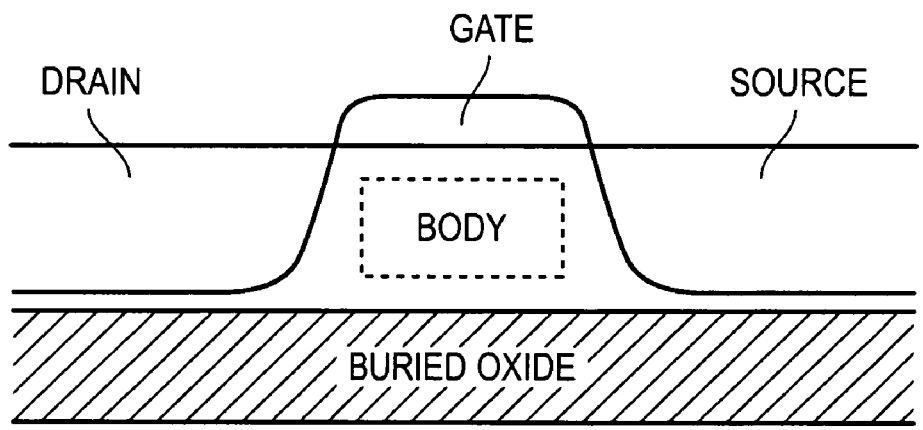
FIG. 2 schematically illustrates a known silicon-on-insulator device.
Figure 3:
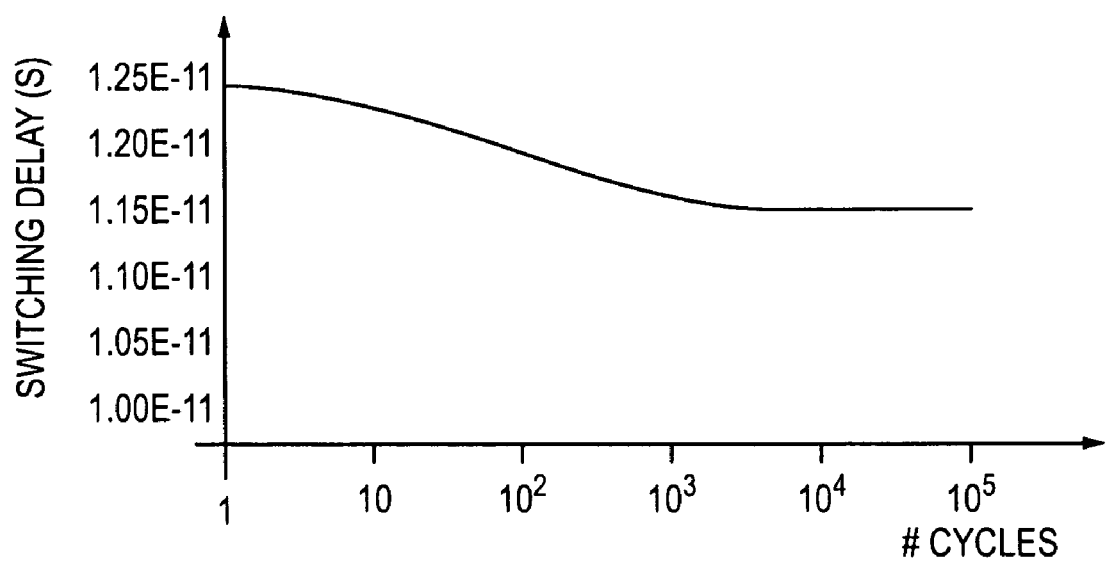
FIG. 3 schematically illustrates the history effect exhibited by the switching delay of a silicon-on-insulator device such as that illustrated in FIG. 2.

Hence, in a timing circuit such as that illustrated in FIG. 1, wherein the timing of both the rising and falling edges of the ICLK clock pulse are dependent on the first switching delay of the circuit components of the timing circuit, regardless of whether an individual circuit component initially has a logical 0 or a logical 1 at its input, each circuit component will exhibit a switching delay which shortens as that circuit component performs repeated switching operations. Consequently both the rising and the falling edges of the output ICLK clock pulse in FIG. 1 will tend to creep earlier in time. Typically the effect will be more pronounced for the falling (second) edge of the ICLK pulse, due to the greater number of circuit components that lie on the path which generates this falling edge (i.e. the additional components in the feedback loop via the delay unit).

However, according to the present invention, the delay associated with the second switching of a given component is introduced, resulting in a cancelling effect between the time evolution of the delay of each switching. The implementation of this technique will be described in more detail with reference to the following figures.

Figure 5A:
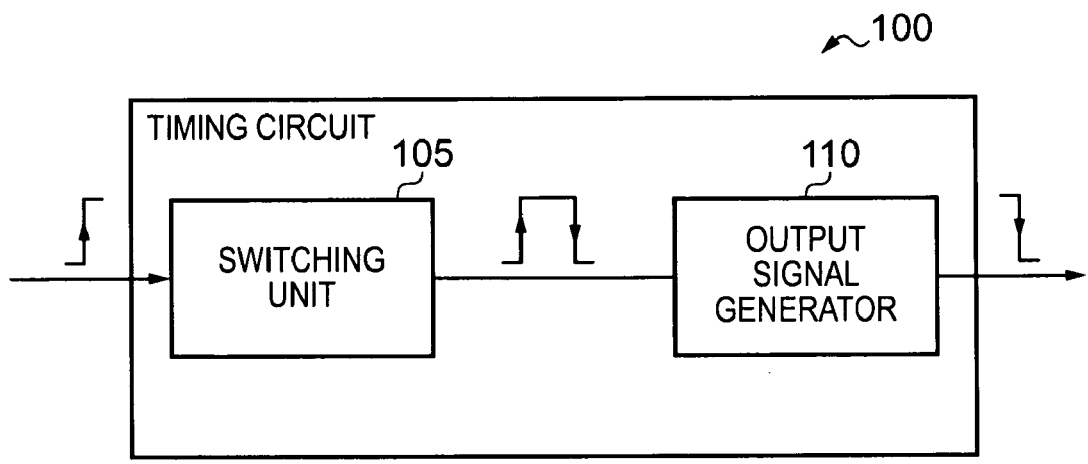
FIG. 5A schematically illustrates a timing circuit comprising a switching unit and output signal generator in one embodiment.

FIG. 5A schematically illustrates a timing circuit 100 in one embodiment comprising a switching unit 105 and an output signal generator 110. The switching unit 105 is configured to respond to a rising edge of its input signal to provide two switches of its output having a first (rising) edge and a second (falling) edge. This pulse, is then received by output signal generator 110 which responds to the second (falling) edge of the pulse to produce the output signal. Because the switching unit 105 performs both a first switch and a second switch in response to the rising edge of the input signal, both the first delay associated with the first switching and the second delay associated with the second switching have been introduced into the illustrated signal path.

Figure 5B:
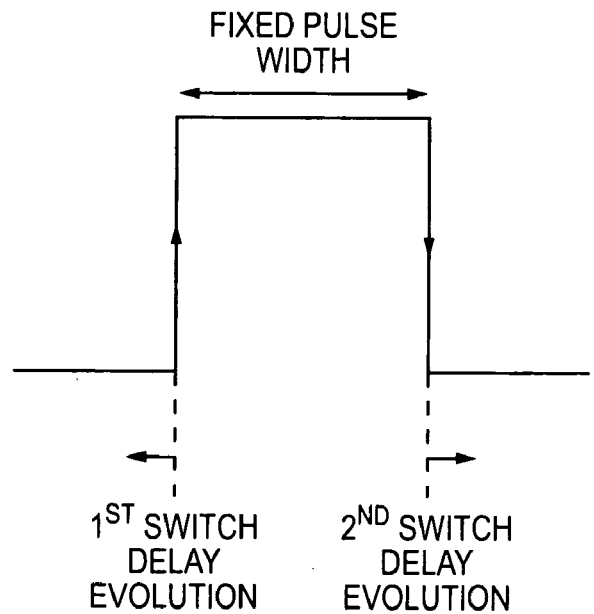
FIG. 5B schematically illustrates the evolution of the first and second switching delays at the output of the switching unit of FIG. 5A.

The illustration in FIG. 5B shows the pulse generated by switching unit 105. The time evolution of the delay associated with the first switch will tend to bring the rising edge earlier in time, whilst the time evolution of the second switching will tend to bring the falling edge of the pulse later in time. In combination, these two effects counteract one another such that when the output signal generator 110 selects only the falling edge of the output pulse of the switching unit the timing of this output is relatively constant (note that this is dependent on a fixed width of the pulse.

Figure 6:
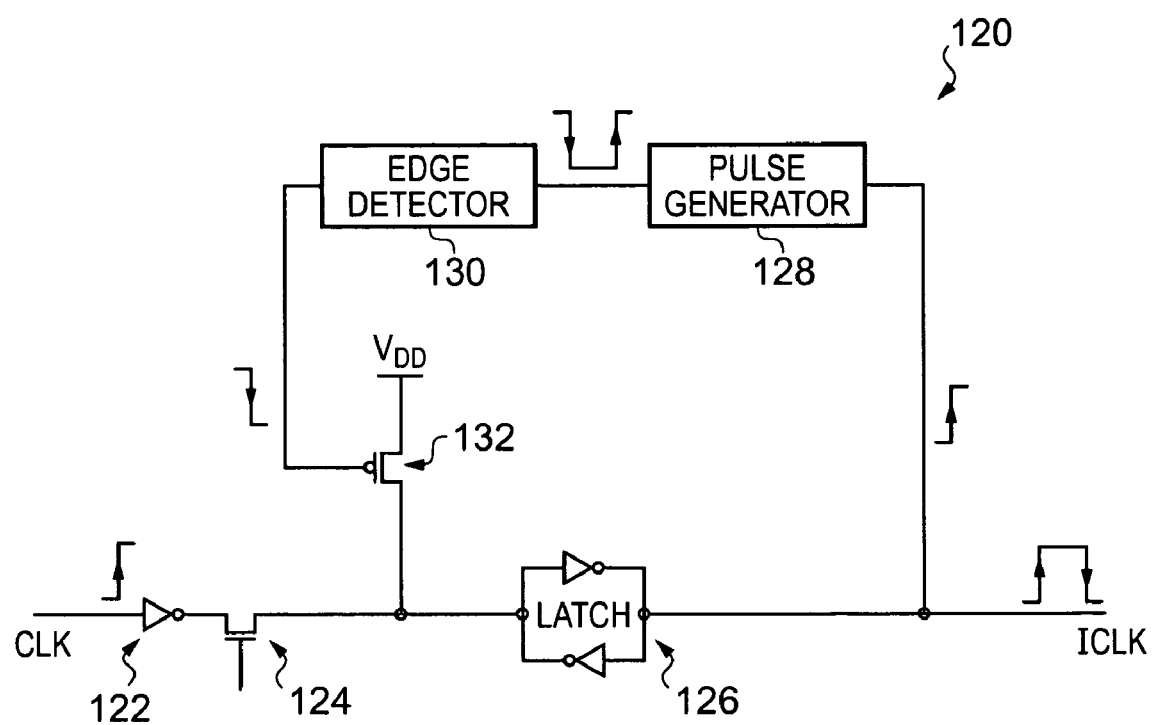
FIG. 6 schematically illustrates an internal clock generation circuit according to one embodiment.

FIG. 6 schematically illustrates an internal clock generation circuit 120 according to one embodiment. The rising edge of the external clock signal CLK is received via inverter 122 and transmission gate 124. The rising transition of CLK causes the state held by latch 126 to invert. The resulting rising edge forms the rising edge of the generated ICLK pulse. This rising edge is also passed back via a feedback loop comprising a timing circuit such as that illustrated in FIG. 5A, wherein the switching unit is provided by pulse generator 128 and the output signal generator is provided by edge detector 130. The rising edge received by pulse generator 128 causes it to switch twice to produce a corresponding pulse. This pulse is received by edge detector 130, which is configured to detect only the second (rising in this example) edge of the pulse. The falling edge then generated by edge detector 130 causes PMOS transistor 132 to connects the input of latch 126 to VDD. Hence, the input to latch 126 is pulled high again, causing the state held by latch 126 to invert once more, forming the falling edge of the output pulse ICLK. Significantly, whilst the timing of the rising edge of ICLK will depend only on the first switching delay of the relevant circuit components (i.e. inverter 122, transmission gate 124 and latch 126), the timing of the falling edge of ICLK will depend on both the first switching delay and the second switching delay of the relevant circuit components (i.e. pulse generator 128 and latch 126, since these are the components which switch twice in the generation of the ICLK pulse). The introduction of the second switching delay into the critical path for the generation of the falling edge of the ICLK path means that the timing of this falling edge is now dependent on both the first switching delay (which will tend to shorten) and the second switching delay (which will tend to lengthen). By tuning the influence of these two delay factors (as will be described in more detail in the following), the system designer can carefully control the timing of the ICLK falling edge.

Figure 7A:
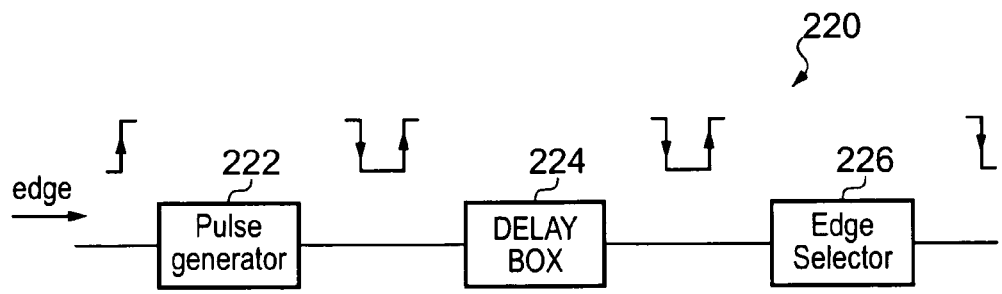
FIG. 7A schematically illustrates a timing circuit in one embodiment.

FIG. 7A schematically illustrates a timing circuit 220 in one embodiment. This timing circuit 220 comprises a pulse generator 222, a delay box 224 and an edge selector 226. The edge in the signal received by pulse generator 222 results in a pulse which is passed to delay box 224. Delay box 224 passes a delayed version of the received pulse to edge selector 226, which responds to the latter edge (rising in this example) to generate its output signal (a falling edge in this example). Hence overall the timing circuit 220 generates an output edge in response to a received edge, but wherein the timing of the generated edge is dependent on both a first and second switching delay within the circuit components of the timing circuit. Note that the pulse generator 222 and the delay box 220 will contribute to the second switching delay since the output of both of these components must switch twice. Conversely the edge selector 226 only contributes to the first switching delay since its output must only switch once. As such the circuit components of the edge selector can be considered to form a first set of circuit components and the twice-switching circuit components of the pulse generator and the delay box can be considered to form a second set of circuit components. By selecting the ratio of the numbers of circuit components in each set the system designer can influence the overall switching delay on the output signal.

Figure 7B:
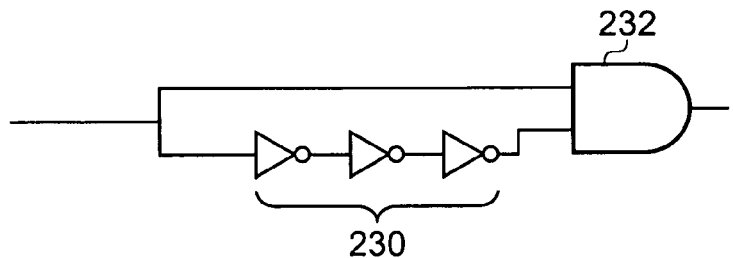
FIG. 7B schematically illustrates an example embodiment of the pulse generator of FIG. 7A.

FIG. 7B schematically illustrates an example configuration of the pulse generator 222 in FIG. 7A comprising a sequence of inverters 230 and an AND gate 232. Because there are an odd number of inverters 230, an edge received by the pulse generator will initially cause a transition at the output of the AND gate, until the edge has propagated through the sequence of inverters at which point the output transitions back to its original value before the edge was received. Thus a pulse is generated in response to the receipt of an edge. Note that in terms of the first and second set of circuit components mentioned above with reference to FIG. 7A, here only AND gate 232 forms part of the second set, since it is only this component of the pulse generator 222 which switches twice.

Figure 7C:
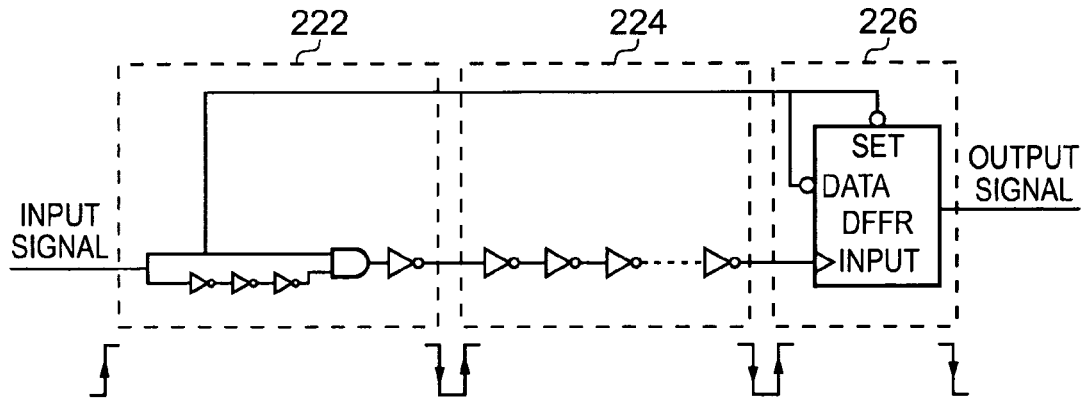
FIG. 7C schematically illustrates in more detail the configuration of the components shown in FIG. 7A.

FIG. 7C illustrates in more detail the further components of the timing circuit 220 illustrated in FIG. 7A. Pulse generator 222 is essentially as described with reference to FIG. 7B, although note the final inverter. Delay box 224 simply comprises a sequence of inverters. The selection of the number of inverters determines the timing of the output pulse from the delay box relative to the timing of the received edge of the input clock signal. Hence selection of this number of inverters enables the timing of the falling output clock edge relative to the rising output clock edge to be determined. The edge selector 226 is, in this example, a positive edge triggered flip-flop. Hence the rising edge of the input signal cause the (inverted) DATA and SET inputs of the flip-flop to fall to zero. Once the signal propagates through the pulse generator 222 and the delay box 224, the rising edge at the input to the flip-flop causes the 0 DATA value to be output, i.e. a falling edge is generated.

Figure 8:
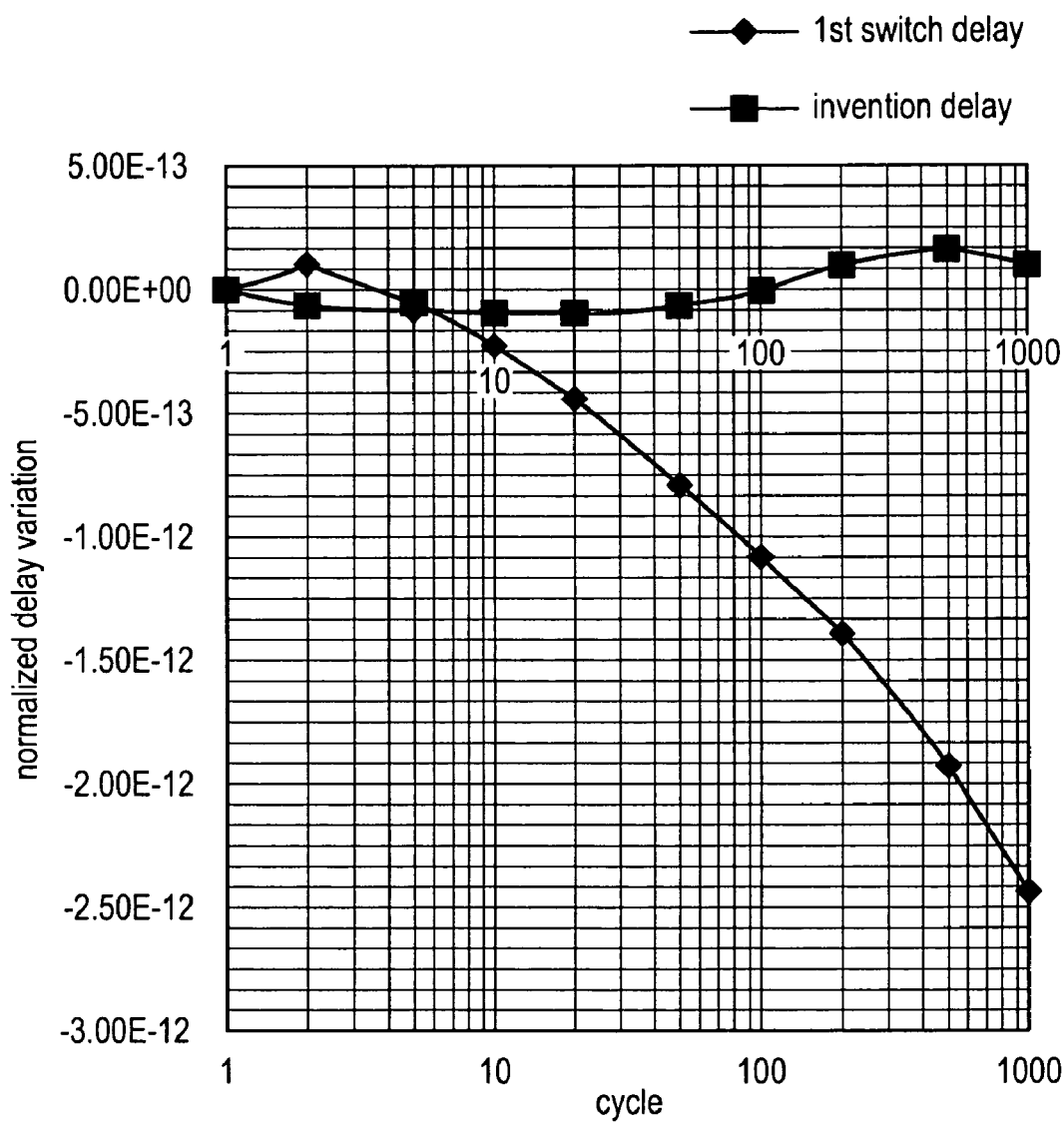
FIG. 8 illustrates the time evolution of the normalized delay variation in one embodiment.

FIG. 8 illustrates a simulation of the normalized delay variation for a timing circuit such as that illustrated in FIGS. 7A-C, which is started up after an extended period of inactivity during which the input was constant. It can be seen that whilst the first switch delay variation trends to shorter and shorter delays over the course of the first thousand cycles, the delay variation according to the invention is substantially constant. In fact, as illustrated, there is a very slight upward trend over the course of the first thousand cycles. In practice, arranging the contributions of the first and second switching delays to perfectly cancel out will be difficult, so a compromise is chosen where the overall delay increases very slightly. This can be beneficial, for example in the context of a memory device, as will be discussed in the following.

Figure 9:
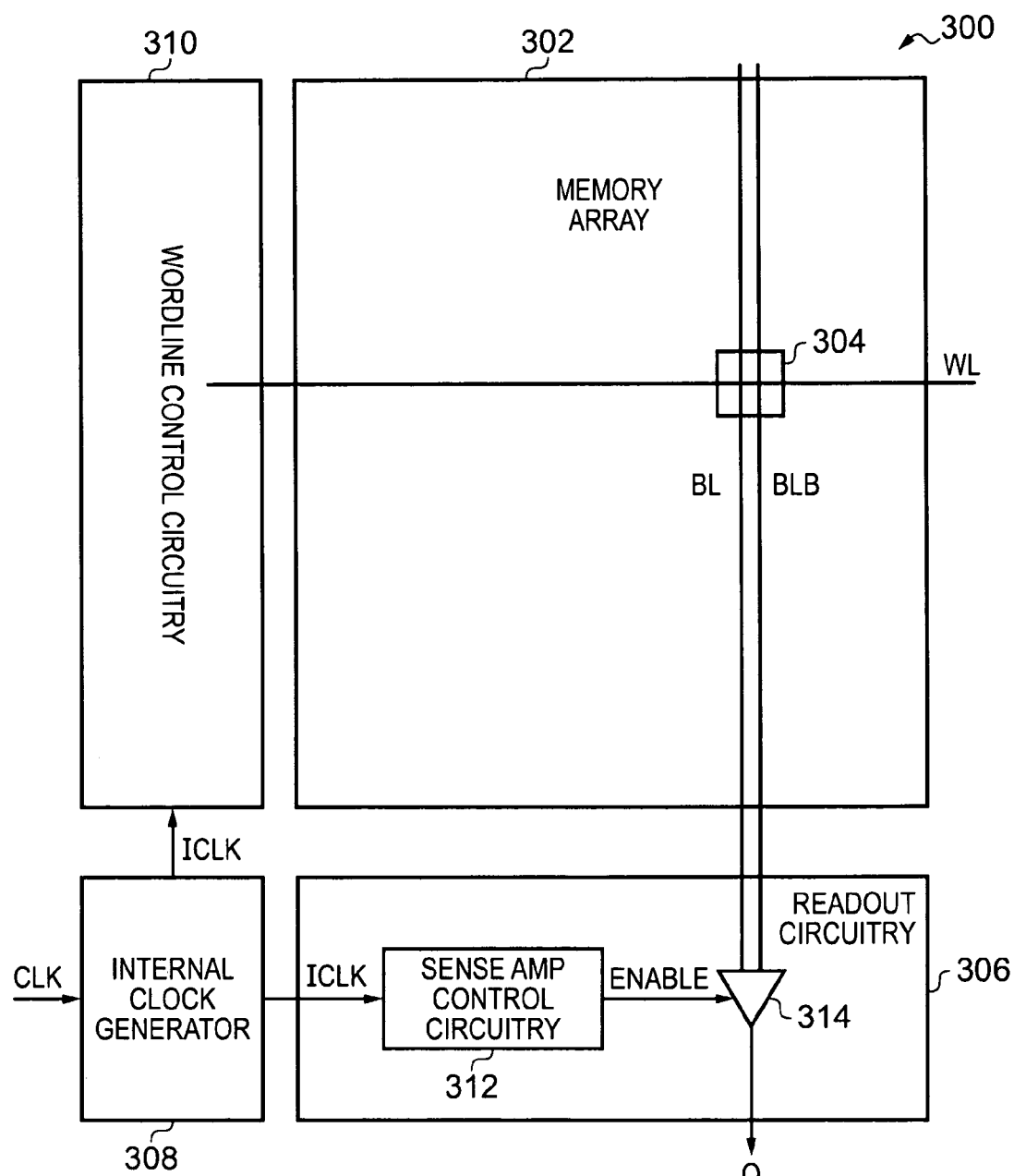
FIG. 9 schematically illustrates a memory device comprising a timing circuit in one embodiment.

FIG. 9 schematically illustrates a memory device 300 comprising an array 302 of memory cells. An example memory cell 304 is illustrated. Each memory cell has a corresponding word line WL and a pair of bit lines BL and BLB. Associated with the memory array 302 is read out circuitry 306 which is configured to enable the value stored in memory cell 304 to be measured by determining a voltage difference between the bit lines BL and BLB. The memory device 300 also comprises internal clock generator 308. The internal clock generator receives an external clock signal CLK and converts this external clock signal into an internal clock signal ICLK suitable for the purposes of the memory device 300. In particular, memory device 300 is a self-timing memory device, wherein the internal clock is generated only in dependence on a rising edge of the external clock signal CLK. The internal clock signal ICLK is passed from the internal clock generator 308 to both word line control circuitry 310 and sense amp control circuitry 312. On the basis of the timing of this internal clock signal (as will be described in more detail with reference to FIG. 10) the word line control circuitry asserts the word line associated with memory cell 304 and the sense amp control circuitry asserts a sense amp enable signal which enables sense amplifier 314. When enabled, sense amplifier 314 measures a voltage difference between the bit lines BL and BLB which has developed following the assertion of the word line signal WL, which connects memory cell 304 to the bitlines. On this basis the output value Q representative of the value stored in memory cell 304 is generated. The output value Q depends on the voltage difference measured by sense amplifier 314 and because the voltage on each bitline develops as a function of the time since the word line WL was asserted, the timing of the assertion of the sense amp enable signal is critical to the value read out. By generating the internal clock signal according to the techniques of the present invention, this critical timing can be maintained, despite any time evolution of the switching delays of the circuit components forming the internal clock generator. This is discussed in more detail with reference to FIG. 10.

Figure 10:
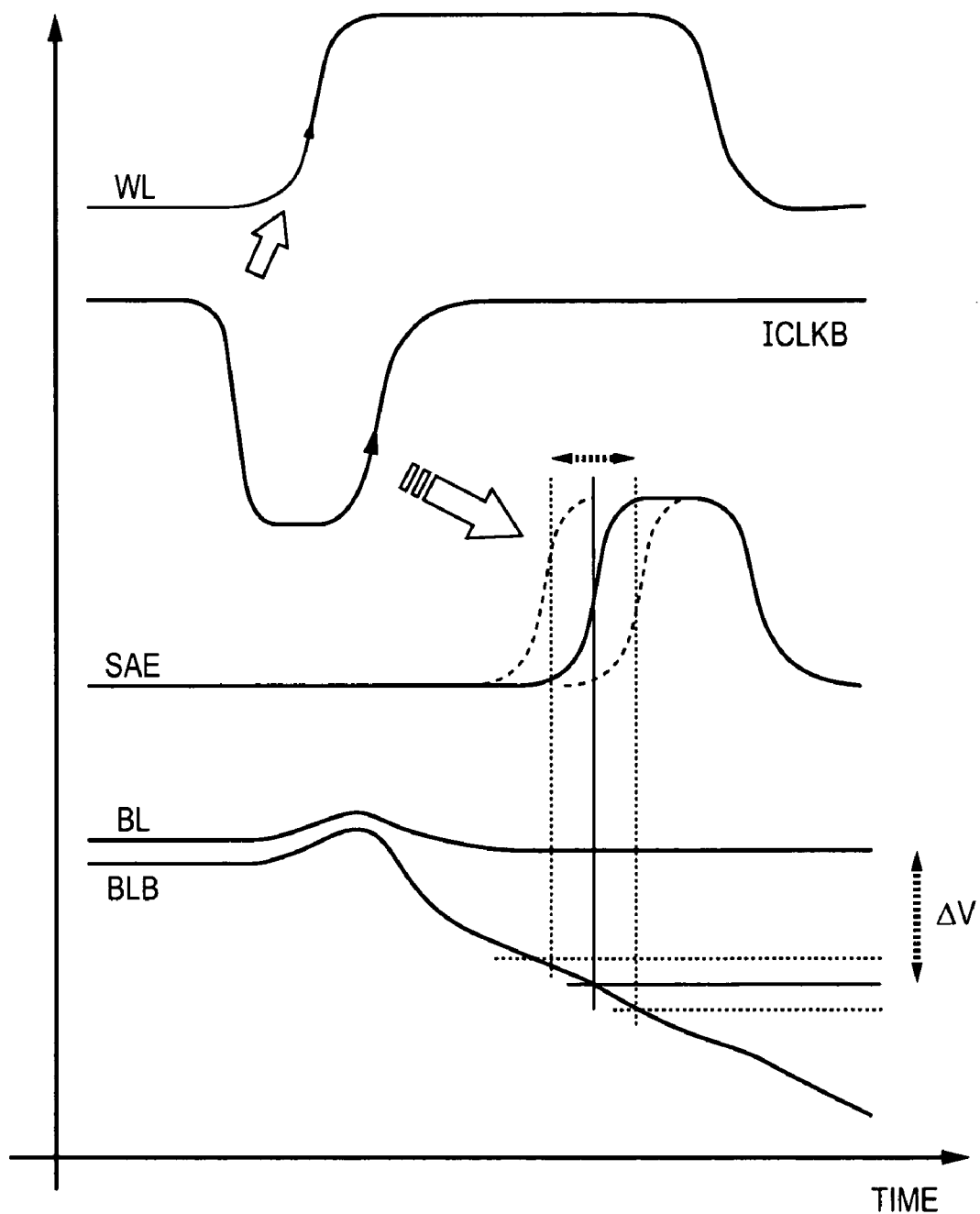
FIG. 10 schematically illustrates the time evolution of various internal signals in the memory device of FIG. 9.

FIG. 10 schematically illustrates the relative timing of various signals within memory device 300 in FIG. 9. It should be noted that only the relative timings of the various signals are representative. The internal clock signal (represented here in its inverted form of ICLKB) triggers the assertion of the word line signal WL by its (first) falling edge, whilst its (second) rising edge triggers the sense amp enable signal SAE. The assertion of the word line signal WL connects the memory cell 304 to the bit lines BL and BLB and thus one of the bit lines begins to discharge current (depending on the logical value stored in the memory cell). The timing of the sense amp enable signal SAE is critical to determining whether the sense amplifier reads a 1 or a 0 in dependence on the relative voltages of the bit lines BL and BLB. As can be seen in the figure, a variation in timing of the sense amp enable signal SAE translates into a change in the voltage difference $\Delta V$ experienced by the sense amp 314. Depending on the threshold set of distinguishing between a "1" and a "0" stored in the memory cell, this voltage difference variation could cause a different value to be read.

In particular, in order to provide a memory device which has as short a response time as possible, the internal clock signal is typically configured to trigger the sense amp enable signal SAE as early as possible, i.e. at the earliest time that it is reliably possible to determine whether the stored value in the memory cell from the voltages of the bit lines. For this reason, if the generation of the internal clock signal ICLKB were to result in the rising edge of the ICLKB signal evolving towards an earlier rising edge, this would result in the sense amp enable signal SAE being asserted earlier and resulting in an unreliable read process, since insufficient voltage difference between the bit lines BL and BLB might have developed when the sense amp enable signal is asserted. However, the internal clock generator 308 illustrated in FIG. 9 has a timing circuit which is configured to produce an output timing signal which, has a timing dependent on both a first switching delay and a second switching delay, which enables the ICLKB signal to be generated in a more reliable fashion. In fact, when the overall switching delay is configured as illustrated in FIG. 8, such that the delay will very slightly increase over time, it is ensured that the read margin for the bit lines will only increase, ensuring a reliable read operation for the memory device, even as switching delays evolve over time in the timing circuitry.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A timing circuit configured to generate an output timing signal in dependence on an input timing signal, said timing circuit comprising:
a plurality of circuit components, each circuit component configured to receive an input dependent on said input timing signal and to generate an output in dependence on said input, each circuit component configured to perform switching operations by switching an output level of said output in response to a transition of an input level of said input,
wherein each circuit component exhibits a delay in switching said output level following said transition of said input level, said delay comprising a first delay associated with a first switching of said output level and a second delay associated with a second switching of said output level, said first switching being in an opposite direction to said second switching, and wherein said first delay and said second delay exhibit a change in magnitude as each circuit component repeatedly performs said switching operations, said change in magnitude being in opposite directions for said first delay and said second delay respectively; and
said plurality of circuit components arranged such that a timing of said output timing signal is dependent on both said first delay and said second delay.

2. The timing circuit as claimed in claim 1, wherein said circuit components are configured such that said first delay becomes shorter and said second delay becomes longer as said circuit components repeatedly perform said switching operations.

3. The timing circuit as claimed in claim 1, wherein said circuit components are configured such that said first delay becomes longer and said second delay becomes shorter as said circuit components repeatedly perform said switching operations.

4. A timing circuit as claimed in claim 1, wherein said plurality of circuit components comprises:

a switching unit configured to perform both said first switching and said second switching in response to said transition of said input level; and
and an output signal generator configured to generate said output timing signal in dependence on said second switching of said switching unit.

5. A timing circuit as claimed in claim 1, wherein said switching unit comprises a pulse generation circuit and said output signal generator comprises an edge selection circuit, said pulse generation circuit configured to generate a pulse formed of a first edge and a second edge in response to a transition of said input timing signal, and said edge selection circuit configured to generate said output timing signal in dependence on said second edge.

6. A timing circuit as claimed in claim 5, further comprising a delay circuit, said delay circuit configured to receive said pulse from said pulse generation circuit and to provide said edge selection circuit with a delayed pulse.

7. A timing circuit as claimed in claim 5, further comprising a latch circuit, said latch circuit configured to generate a first clock pulse edge in response to said transition of said input timing signal and to generate a second clock pulse edge in response to said output timing signal.

8. A timing circuit as claimed in claim 1, wherein said plurality of circuit components comprises a first set of circuit components and a second set of circuit components,
wherein said first set of circuit components contribute only said first delay to said timing of said output timing signal and said second set of circuit components contribute only said second delay to said timing of said output timing signal.

9. A timing circuit as claimed in claim 8, wherein a number of said first set of circuit components and a number of said second set of circuit components are selected such that said timing of said output timing signal is substantially constant as said circuit components repeatedly perform said switching operations.

10. A timing circuit as claimed in claim 8, wherein a number of said first set of circuit components and a number of said second set of circuit components are selected such that said timing of said output timing signal does not become earlier as said circuit components repeatedly perform said switching operations.

11. A timing circuit as claimed in claim 1, wherein said timing circuit is a delay circuit.

12. A timing circuit as claimed in claim 1, configured such that said first switching is performed in response to a rising edge of said input level and said second switching is performed in response to a falling edge of said input level.

13. A timing circuit as claimed in claim 1, configured such that said first switching is performed in response to a falling edge of said input level and said second switching is performed in response to a rising edge of said input level.

14. A timing circuit as claimed in claim 1, wherein said switching operations cause said first delay and said second delay to evolve to steady state values.

15. A timing circuit as claimed in claim 1, wherein said timing circuit is a silicon-on-insulator device.

16. A timing circuit as claimed in claim 15, wherein during inactivity of said timing circuit said timing circuit is configured to hold said input timing signal at a predetermined value.

17. A timing circuit as claimed in claim 1, wherein said timing circuit is a memory device timing circuit.

18. A timing circuit as claimed in claim 17, wherein said memory device timing circuit is a sense amplifier timing circuit.

19. A timing circuit as claimed in claim 18, wherein said output timing signal initiates a sense amplifier enable signal.

20. A timing circuit as claimed in claim 17, wherein said input timing signal initiates a word line activation signal.

21. A memory device comprising a timing circuit as claimed in claim 1.

22. A non-transitory recording medium storing computer-readable instructions configured to generate a timing circuit as claimed in claim 1.

23. A timing circuit configured to generate an output timing signal in dependence on an input timing signal, said timing circuit comprising:

a plurality of circuit component means, each circuit component means for receiving an input dependent on said input timing signal and generating an output in dependence on said input, each circuit component means for performing switching operations by switching an output level of said output in response to a transition of an input level of said input, wherein each circuit component means exhibits a delay in switching said output level following said transition of said input level, said delay comprising a first delay associated with a first switching of said output level and a second delay associated with a second switching of said output level, said first switching being in an opposite direction to said second switching, and wherein said first delay and said second delay exhibit a change in magnitude as each circuit component repeatedly performs said switching operations, said change in magnitude being in opposite directions for said first delay and said second delay respectively; and said plurality of circuit component means arranged such that a timing of said output timing signal is dependent on both said first delay and said second delay.

24. A method of generating an output timing signal in dependence on an input timing signal, the method comprising the steps of:

in each of a plurality of circuit components receiving an input dependent on said input timing signal and generating an output in dependence on said input by performing switching operations wherein an output level of said output is switched in response to a transition of an input level of said input, wherein each circuit component exhibits a delay in switching said output level following said transition of said input level, said delay comprising a first delay associated with a first switching of said output level and a second delay associated with a second switching of said output level, said first switching being in an opposite direction to said second switching and wherein said first delay and said second delay exhibit a change in magnitude as said switching operations are repeatedly performed, said change in magnitude being in opposite directions for said first delay and said second delay respectively;

and generating said output timing signal using said plurality of circuit components such that a timing of said output timing signal is dependent on both said first delay and said second delay.

\* \* \* \* \*